United States Patent
Koyanagi et al.

(10) Patent No.: US 8,405,432 B2
(45) Date of Patent: Mar. 26, 2013

(54) OUTPUT BUFFER CIRCUIT, INPUT BUFFER CIRCUIT, AND INPUT/OUTPUT BUFFER CIRCUIT

(75) Inventors: Masaru Koyanagi, Ota-ku (JP);
Yasufumi Kajiyama, Setagaya-ku (JP);
Ryo Fukuda, Yokohama (JP);
Fumiyoshi Matsuoka, Kawasaki (JP);
Yasuhiro Suematsu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 27 days.

(21) Appl. No.: 12/963,114

(22) Filed: Dec. 8, 2010

(65) Prior Publication Data
US 2011/0133791 A1    Jun. 9, 2011

(30) Foreign Application Priority Data
Dec. 9, 2009  (JP) .................. 2009-279267

(51) Int. Cl.
*H03K 3/01*    (2006.01)
(52) U.S. Cl. .................. 327/109; 326/83
(58) Field of Classification Search .................. None
See application file for complete search history.

(56) References Cited

U.S. PATENT DOCUMENTS

| | | | |
|---|---|---|---|
| 6,208,168 B1 * | 3/2001 | Rhee .................. | 326/83 |
| 6,353,346 B1 * | 3/2002 | Chan .................. | 327/112 |
| 6,456,124 B1 * | 9/2002 | Lee et al. .................. | 327/108 |
| 6,577,551 B2 | 6/2003 | Ito et al. | |
| 6,894,529 B1 * | 5/2005 | Chong et al. .................. | 326/30 |
| 7,123,049 B2 * | 10/2006 | Satou et al. .................. | 326/30 |
| 7,359,255 B2 | 4/2008 | Kimura et al. | |
| 2009/0146683 A1 * | 6/2009 | Kim .................. | 326/30 |

FOREIGN PATENT DOCUMENTS

JP    2009-134349    6/2009

* cited by examiner

*Primary Examiner* — Crystal L Hammond
(74) *Attorney, Agent, or Firm* — Oblon, Spivak, McClelland, Maier & Neustadt, L.L.P.

(57) ABSTRACT

An output buffer circuit in accordance with an embodiment comprises a plurality of buffer circuits, each of the buffer circuits including a transistor operative to change an output signal of an output terminal in response to a change in an input signal, the output buffer circuit being configured to enable the plurality of buffer circuits to be driven selectively. Each of the plurality of buffer circuits includes a plurality of output transistors having respective current paths formed in parallel to one another between a fixed voltage terminal supplying a certain fixed voltage and an output terminal, and being selectively rendered in an operable state in accordance with a control signal provided from external. The plurality of output transistors included in each of the plurality of buffer circuits are formed having a certain size ratio.

22 Claims, 13 Drawing Sheets

FIG. 7

| Without Dummy Half Bit | Case1 | | | | Case2 | | | | Case3 | | | | Case4 | | | |
|---|---|---|---|---|---|---|---|---|---|---|---|---|---|---|---|---|
| Lower 2 Bits of Counter → | - | 1 | 2 | - | - | 1 | 2 | - | - | 1 | 2 | - | - | 1 | 2 | - |
| Bit of Trimming Circuit → | .5 | 1 | 2 | 0 | .5 | 1 | 2 | 0 | .5 | 1 | 2 | 0 | .5 | 1 | 2 | 0 |
| N-1 | 0 | 0 | 0 | - | 0 | 0 | 0 | - | 0 | 0 | 0 | - | 0 | 0 | 0 | - |
| When Answer was Here ⇒ | - | ● | | | | | | | | | | | | | | |
| | - | 1 | - | - | - | ● | - | - | - | - | - | - | - | - | - | - |
| N | - | 1 | 0 | - | - | 1 | 0 | - | - | 1 | 0 | - | - | 1 | 0 | - |
| When Answer was Here ⇒ | | | | | | | | | | | ● | | | | | |
| | - | - | - | - | - | - | - | - | - | ● | - | - | - | ● | - | - |
| N+1 | - | 0 | 1 | - | - | 0 | 1 | - | - | 0 | 1 | - | - | 0 | 1 | - |
| Trim Value → | -1 | 0 | | | -1 | 0 | | 1 | -1 | 0 | 1 | | -1 | 0 | 1 | 1 |

| With Dummy Half Bit | Case5 | | | | Case6 | | | | Case7 | | | | Case8 | | | |
|---|---|---|---|---|---|---|---|---|---|---|---|---|---|---|---|---|
| Lower 2 Bits of Counter → | - | 1 | 2 | - | - | 1 | 2 | - | - | 1 | 2 | - | - | 1 | 2 | - |
| Bit of Trimming Circuit → | .5 | 1 | 2 | 0 | .5 | 1 | 2 | 0 | .5 | 1 | 2 | 0 | .5 | 1 | 2 | 0 |
| N-1 | 0 | 0 | 0 | - | 0 | 0 | 0 | - | 0 | 0 | 0 | - | 0 | 0 | 0 | - |
| When Answer was Here ⇒ | 1 | ● | | | | | | | | | | | | | | |
| | 1 | 0 | 0 | - | 1 | 0 | 0 | - | 1 | 0 | 0 | - | 1 | 0 | 0 | - |
| N | 1 | 1 | 0 | - | 1 | 1 | 0 | - | 1 | 1 | 0 | - | 1 | 1 | 0 | - |
| | | | | | | ● | | | | | ● | | | | | |
| | 0 | 1 | 1 | - | 0 | 1 | 1 | - | 0 | 1 | 1 | - | 0 | 1 | 1 | - |
| When Answer was Here ⇒ | | | | | | | | | | | | | | | ● | |
| N+1 | 0 | 0 | 1 | - | 0 | 0 | 1 | - | 0 | 0 | 1 | - | 0 | 0 | 1 | - |
| Trim Value → | -1 | 0 | | | -1 | 0 | | 1 | -1 | 0 | 1 | | -1 | 0 | 1 | 1 |

Advantage Here

US 8,405,432 B2

OUTPUT BUFFER CIRCUIT, INPUT BUFFER CIRCUIT, AND INPUT/OUTPUT BUFFER CIRCUIT

CROSS-REFERENCE TO RELATED APPLICATION

This application is based upon and claims the benefit of priority from prior Japanese Patent Application No. 2009-279267, filed on Dec. 9, 2009, the entire contents of which are incorporated herein by reference.

BACKGROUND

1. Field

Embodiments described in this specification relate generally to an output buffer circuit, an input buffer circuit, and an input/output buffer circuit disposed between an input/output pad and various kinds of circuits in a semiconductor integrated circuit.

2. Description of the Related Art

A semiconductor integrated circuit has a buffer circuit disposed between an input/output pad and various kinds of circuits. The slew rate of this kind of buffer circuit can be changeable in several stages in accordance with the specification and so on of the semiconductor integrated circuit. In this buffer circuit, multiple stages of buffer circuits are provided, and some of them are selectively driven or all are driven, thereby rendering the slew rate thereof changeable a number of states such as low drive state (Under Drive), normal drive state (Normal), and high drive state (Over Drive).

However, when adjusting the slew rate in several stages in this way, dispersion of transistor characteristics in manufacturing processes sometimes causes the drive capacity of each of the buffer circuits to change, whereby the difference in drive capacity of each of the drive states differs from expected value. The drive capacity of each stage of buffer circuit changing more than expected in this way causes timing precision of input/output signals to deteriorate and inhibits high-speed operation of the circuit.

BRIEF DESCRIPTION OF THE DRAWINGS

FIG. 7 is an explanatory view showing advantages of the CMOS output buffer circuit in accordance with the fifth embodiment of the present invention.

DETAILED DESCRIPTION

Figure 1:
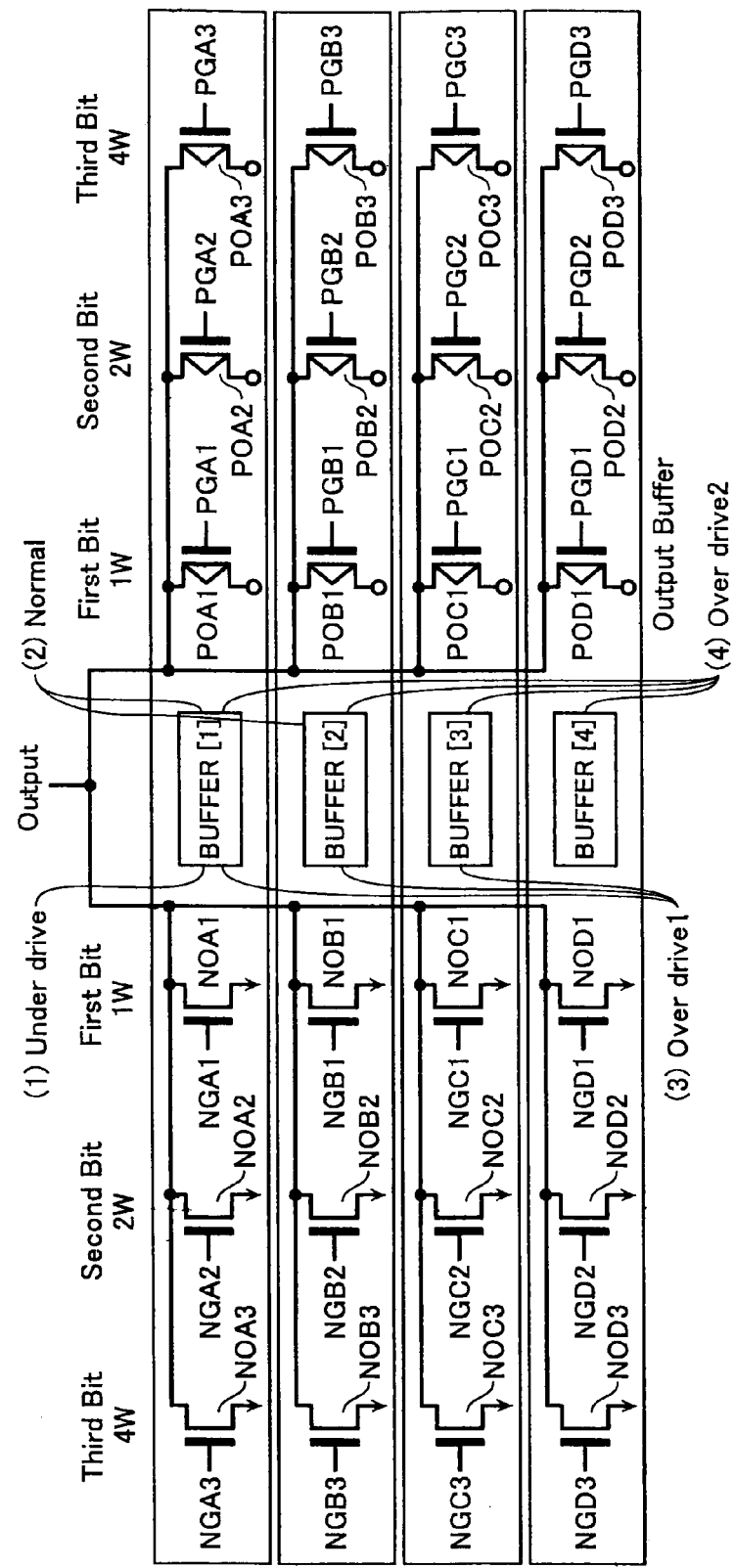
FIG. 1 is a circuit diagram of a CMOS output buffer circuit in accordance with a first embodiment of the present invention.

An output buffer circuit in accordance with an embodiment comprises a plurality of buffer circuits, each of the buffer circuits including a transistor operative to change an output signal of an output terminal in response to a change in an input signal, the output buffer circuit being configured to enable the plurality of buffer circuits to be driven selectively. Each of the plurality of buffer circuits includes a plurality of output transistors having respective current paths formed in parallel to one another between a fixed voltage terminal supplying a certain fixed voltage and an output terminal, and being selectively rendered in an operable state in accordance with a control signal provided from external. The plurality of output transistors included in each of the plurality of buffer circuits are formed having a certain size ratio.

Next, embodiments of the present invention are described in detail with reference to the drawings.

[First Embodiment]

First, an output buffer circuit (CMOS output buffer circuit) in accordance with a first embodiment of the present invention is described with reference to FIG. 1.

This output buffer circuit comprises four stages of buffer circuits BUFFER [1]-[4]. Some or all of these four stages of buffer circuits BUFFER [1]-[4] are selectively driven in accordance with an expected slew rate of an output signal. For example, in a low drive state (Under Drive), only buffer circuit BUFFER [1] is driven; in a normal drive state (Normal), buffer circuits BUFFER [1]-[2] are driven; in a first high drive state (Over Drive 1), buffer circuits BUFFER [1]-[3] are driven; and in a second high drive state (Over Drive 2), all buffer circuits BUFFER [1]-[4] are driven.

Further, each of the buffer circuits BUFFER [1]-[4] has a plurality of PMOS transistors and NMOS transistors (output transistors) connected in parallel between a power supply voltage terminal or a ground terminal and an output terminal. The buffer circuit BUFFER [1] includes three PMOS transistors (output transistors) POA1-POA3 and three NMOS transistors (output transistors) NOA1-NOA3. The buffer circuit BUFFER [2] includes three PMOS transistors POB1-POB3 and three NMOS transistors NOB1-NOB3. The buffer circuit BUFFER [3] includes three PMOS transistors POC1-POC3 and three NMOS transistors NOC1-NOC3. The buffer circuit BUFFER [4] includes three PMOS transistors POD1-POD3 and three NMOS transistors NOD1-NOD3.

The three PMOS transistors POA1-POA3 in the buffer circuit BUFFER [1] have an on-state current ratio of transistors set to 1:2:4 as an example. This can be realized by, for example, setting channel length of transistors to a constant value and setting channel width of transistors to 1:2:4. The three NMOS transistors NOA1-NOA3 in the buffer circuit BUFFER [1] have an on-state current ratio of transistors set to 1:2:4 as an example.

The PMOS transistors POA1-POA3 are switchable between an on state and an off state by gate signals PGA1-PGA3. The buffer circuit BUFFER [1] may be set such that only some of the PMOS transistors POA1-POA3 are set in an operable state, the remaining ones being set in a non-operable state, in order to fine-adjust the drive capacity of the buffer circuit BUFFER [1]. That is, using the trimming circuit not shown in FIG. 1, some of the gate signals PGA1-PGA3 may be fixed at a power supply voltage of the CMOS output buffer circuit or at a voltage higher than the power supply voltage of the CMOS output buffer circuit (for example, a voltage VCC), whereby some of the transistors POA1-POA3 are fixed in a non-operation state.

Similarly, the NMOS transistors NOA1-NOA3 are switchable between an on state and an off state by gate signals NGA1-NGA3. The buffer circuit BUFFER [1] may be set such that only some of the NMOS transistors NOA1-NOA3 are set in an operable state, the remaining ones being set in a non-operable state, in order to fine-adjust the drive capacity of the buffer circuit BUFFER [1]. That is, using the trimming circuit not shown in FIG. 1, some of the gate signals NGA1-NGA3 may be fixed at a ground voltage VSS, whereby some of the transistors NOA1-NOA3 are fixed in a non-operation state.

Selectively setting some or all of the PMOS transistors POA1-POA3 in an operable state and selectively rendering some or all of the NMOS transistors NOA1-NOA3 in an operable state in this way allows the drive capacity of the buffer circuit BUFFER [1] to be fine-adjusted independently of that of the other buffer circuits BUFFER [2]-[4]. Note that trimming can be performed independently for the PMOS transistors POA1-POA3 and the NMOS transistors NOA1-NOA3.

The above is a description of the buffer circuit BUFFER [1], but the other buffer circuits BUFFER [2]-[4] are configured similarly, and are each similarly capable of having the drive capacity adjusted unrelated to (independently of) other buffer circuits. Note that, for example, in the case of not driving the entire buffer circuit BUFFER [4], all of gate signals PGD1-PGD3 are fixed at the power supply voltage of the CMOS output buffer circuit or at a voltage higher than the power supply voltage of the CMOS output buffer circuit (for example, a voltage VCC). The same applies to the other buffer circuits BUFFER [2] and [3].

Fine-adjusting the drive capacity of each of the buffer circuits BUFFER [1]-[4] in this way allows the difference in drive capacity between the above-mentioned low drive state (Under Drive), normal drive state (Normal), first high drive state (Over Drive 1), and second high drive state (Over Drive 2) to be appropriately adjusted.

Note that in FIG. 1, a CMOS output buffer circuit is shown, but the present invention may also be applied to a PMOS output buffer circuit including only PMOS transistors, and an NMOS output buffer circuit including only NMOS transistors.

Figure 2:
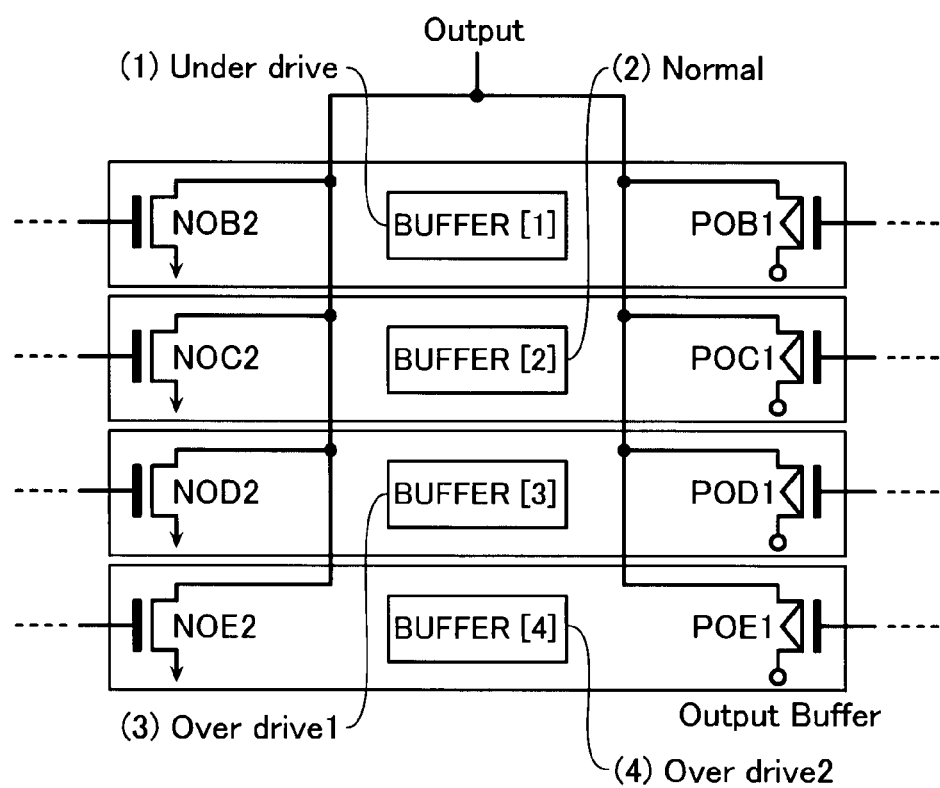
FIG. 2 is a circuit diagram of a comparative example to the CMOS output buffer circuit in accordance with the first embodiment of the present invention.

FIG. 2 is a circuit diagram showing a configuration of a CMOS output buffer circuit in a comparative example of the present embodiment. In this comparative example, each of the buffer circuits BUFFER [1]-[4] includes one PMOS transistor and one NMOS transistor, respectively. In this configuration, the problem arises that, when dispersion occurs in transistor size due to manufacturing process dispersion and so on, the difference and the absolute value in drive capacity between the low drive state (Under Drive), normal drive state (Normal), first high drive state (Over Drive 1), and second high drive state (Over Drive 2) cannot be appropriately set.

In the present embodiment, each stage of the buffer circuits includes a plurality of PMOS transistors and NMOS transistors, and it is therefore possible to appropriately set the drive capacity of each stage of the buffer circuits even if there is manufacturing process dispersion.

[Second Embodiment]

Figure 3:
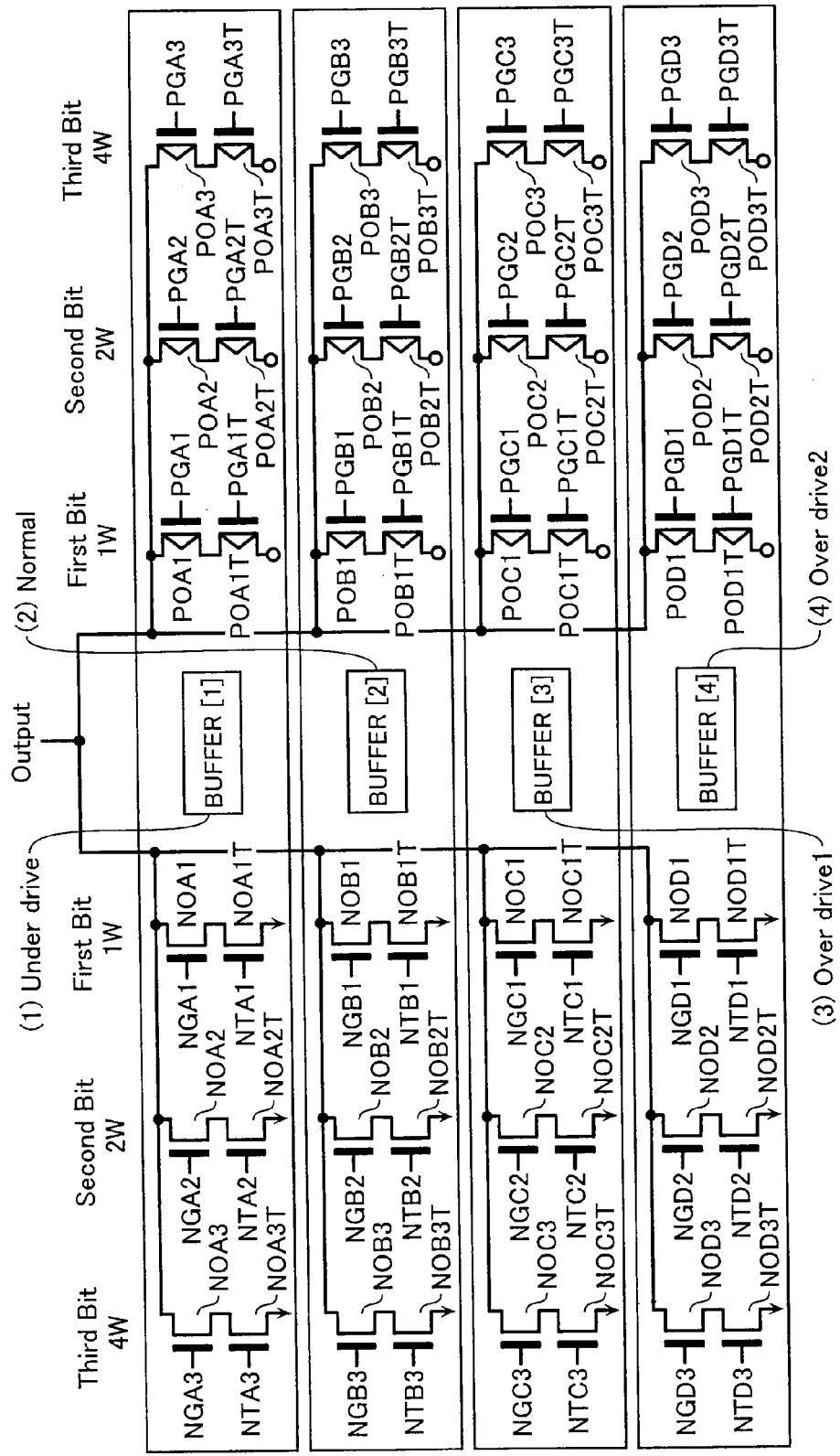
FIG. 3 is a circuit diagram of a CMOS output buffer circuit in accordance with a second embodiment of the present invention.

Next, an output buffer circuit (CMOS output buffer circuit) in accordance with a second embodiment of the present invention is described with reference to FIG. 3. In FIG. 3, identical reference symbols to those in FIG. 1 are assigned to configurative elements identical to those in the first embodiment, and detailed descriptions thereof are omitted.

As shown in FIG. 3, this output buffer circuit of the second embodiment has enable PMOS transistors and enable NMOS transistors further added to the output buffer circuit of the first embodiment.

For example, in buffer circuit BUFFER [1], enable PMOS transistors POA1T-POA3T are connected between the power supply voltage terminal and sources of the PMOS transistors POA1-POA3; and enable NMOS transistors NOA1T-NOA3T are connected between the ground terminal and sources of the NMOS transistors NOA1-NOA3. Similarly, enable PMOS transistors and enable NMOS transistors are connected also in the other buffer circuits BUFFER [2]-[4]. These enable PMOS transistors POA1T-POA3T have on and off state controlled by gate signals PGA1T-PGA3T; and the enable NMOS transistors NOA1T-NOA3T have on and off state controlled by gate signals NGA1T-NGA3T. The result of trimming by a trimming circuit not shown is reflected in these gate signals PGA1T-PGA3T and NGA1T-NGA3T. The same applies to the other buffer circuits BUFFER [2]-[4].

[Third Embodiment]

Figure 4:
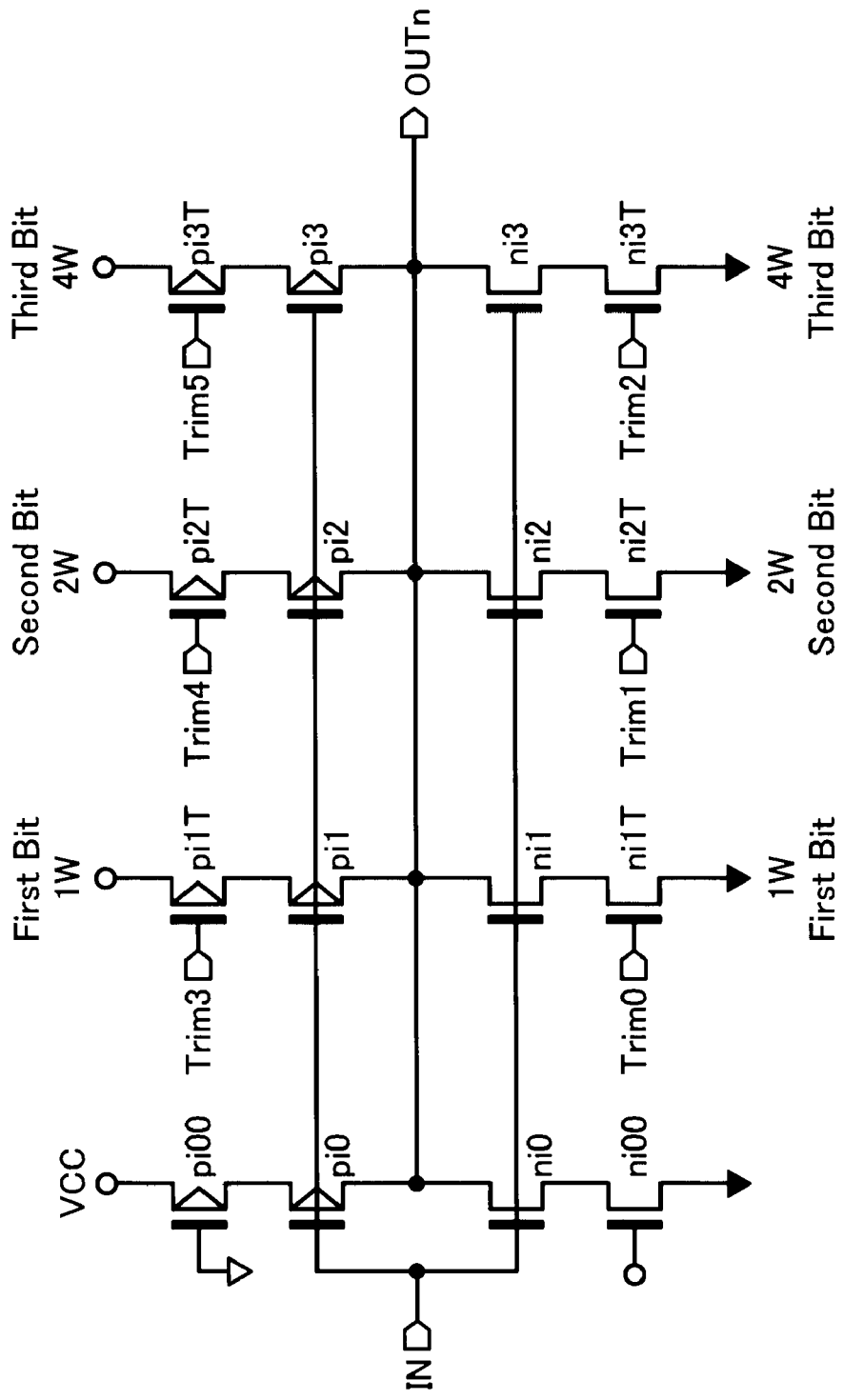
FIG. 4 is a circuit diagram of a CMOS input buffer circuit in accordance with a third embodiment of the present invention.

Next, a CMOS input buffer circuit in accordance with a third embodiment of the present invention is described with reference to FIG. 4. This input buffer circuit comprises PMOS transistors pi0-pi3 and NMOS transistors ni0-ni3, as shown in FIG. 4.

The PMOS transistors pi0-pi3 are connected to form a current path between the power supply voltage terminal (VCC) and an output terminal OUTn; and the NMOS transistors ni0-ni3 are connected to form a current path between the output terminal OUTn and the ground terminal. Gates of these transistors pi0-pi3 and ni0-ni3 are commonly connected to an input terminal of this input buffer circuit; and drains of these transistors pi0-pi3 and ni0-ni3 are set to the output terminal OUTn of this input buffer circuit.

In addition, trimming transistors pi1T-pi3T are provided to selectively render the transistors pi1-pi3 in an operable state. The trimming transistors pi1T-pi3T are connected to form a current path between the power supply voltage terminal and sources of the transistors pi1-pi3. The trimming transistors pi1T-pi3T are PMOS transistors and are switchable between an on state and an off state through application of independent gate voltages Trim3-Trim5. Note that the transistor pi0 also is connected to a PMOS transistor pi00 having a size identical to that of the trimming transistors pi1T-pi3T, but this PMOS transistor pi00 has its gate grounded to be constantly turned on. The PMOS transistor pi0 is therefore constantly set in an operable state.

Moreover, trimming transistors ni1T-ni3T are provided to selectively render the transistors ni1-ni3 in an operable state. The trimming transistors ni1T-ni3T are connected to form a current path between the ground terminal and sources of the transistors ni1-ni3. The trimming transistors ni1T-ni3T are NMOS transistors and are switchable between an on state and an off state through application of independent gate voltages Trim0-Trim2. Note that the transistor ni0 also is connected to an NMOS transistor ni00 having a size identical to that of the trimming transistors ni1T-ni3T, but this NMOS transistor ni00 has its gate constantly applied with the power supply voltage VCC to be constantly turned on. The NMOS transistor ni0 is therefore constantly set in an operable state.

In this configuration, the gate voltages Trim0-Trim5 are selectively set to "H" or "L", whereby the trimming transistors pi1T-pi3T and ni1T-ni3T are selectively switchable to either the operable state or the non-operation state. This allows trimming of transistor size of PMOS transistors pi1T-pi3T and NMOS transistors ni1T-ni3T configuring an inverter circuit to be executed.

Note that description in the above-described embodiment assumes the transistors pi0 and ni0 to be constantly set to the operable state. This is because a current to flow in these transistors pi0 and ni0, for example, when an operation to obtain trimming information is executed in the trimming circuit, or when reading trimming information during power supply start-up. When there is no such operation, these transistors pi0, ni0 and trimming transistors pi00, ni00 may be omitted. Alternatively, the transistors pi00 and ni00 may also be caused to function as trimming transistors.

[Fourth Embodiment]

Next, a trimming circuit of a CMOS output buffer circuit in accordance with a fourth embodiment of the present invention is described with reference to FIG. 5. This fourth embodiment shows the trimming circuit for trimming the PMOS transistors POA1-POA3, POB1-POB3, POC1-POC3, and POD1-POD3 of the buffer circuits BUFFER [1]-[4] in FIG. 1 (this trimming being an operation for determining how many of the transistors POA1-POA3, POB1-POB3, POC1-POC3, and POD1-POD3 are to be rendered in an operable state).

Figure 5:
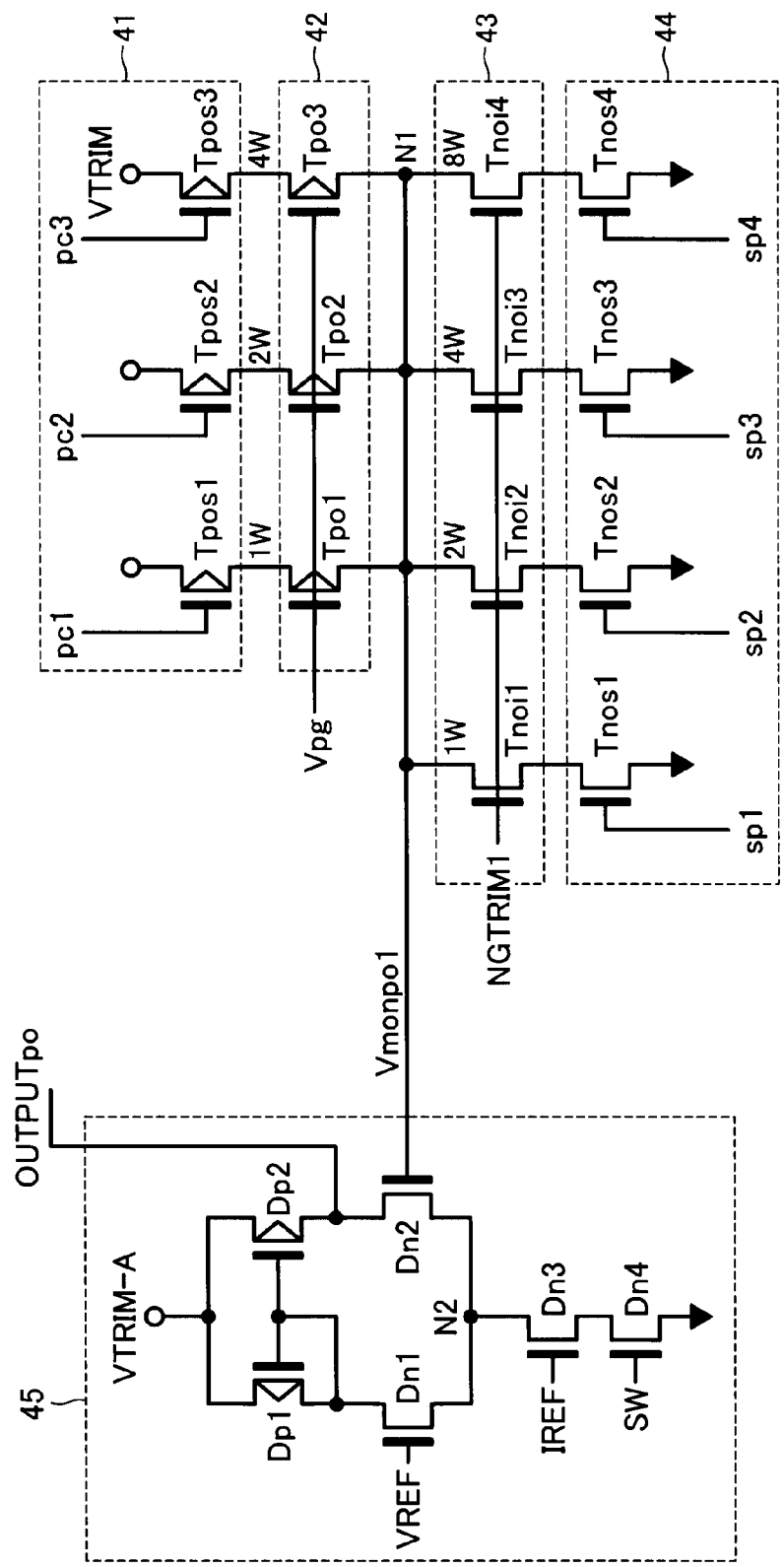
FIG. 5 is a circuit diagram of a CMOS output buffer circuit in accordance with a fourth embodiment of the present invention.

FIG. 5 is an equivalent circuit diagram showing a specific configuration of this trimming circuit. The trimming circuit comprises a switching circuit 41, a dummy circuit 42, a constant current circuit 43, a decode circuit 44, and a detecting circuit 45.

The dummy circuit 42 comprises PMOS transistors Tpo1-Tpo3 (dummy transistors). These PMOS transistors Tpo1-Tpo3 have an on-state current ratio of transistors set to 1:2:4, similarly to the transistors POA1-POA3, POB1-POB3, POC1-POC3, and POD1-POD3 shown in FIG. 1. The dummy circuit 42 is a circuit for judging how these transistors POA1-POA3, POB1-POB3, POC1-POC3, and POD1-POD3 will operate under certain conditions.

The PMOS transistors Tpo1-Tpo3 may have a size identical to that of the transistors POA1-POA3, or they may have a size smaller than that of the transistors POA1-POA3. When the PMOS transistors Tpo1-Tpo3 have a size smaller than that of the transistors POA1-POA3 and so on, a magnitude of a constant current supplied from the constant current circuit 43 also is set to a value that accords with this size.

These transistors Tpo1-Tpo3 are connected to form a current path between a voltage terminal applied with a voltage VTRIM and a node N1, and have their gates applied with a voltage Vpg (for example, the ground voltage VSS) which is the voltage applied to gates of the transistors POA1-POA3, POB1-POB3, POC1-POC3, and POD1-POD3 shown in FIG. 1.

The switching circuit 41 includes PMOS transistors Tpos1-Tpos3 connected to form a current path between sources of the transistors Tpo1-Tpo3 and the voltage terminal of voltage VTRIM. These transistors Tpos1-Tpos3 have on and off state controlled by independent switching signals pc1-pc3.

In addition, the constant current circuit 43 includes four NMOS transistors Tnoi1-Tnoi4, and the decode circuit 44 includes four NMOS transistors Tnos1-Tnos4.

The NMOS transistors Tnoi1-Tnoi4 have their drains connected to node N1 and their sources connected to drains of the NMOS transistors Tnos1-Tnos4, respectively. Moreover, gates of the NMOS transistors Tnoi1-Tnoi4 are supplied with a common gate signal NGTRIM1. The NMOS transistors Tnos1-Tnos4 have their sources grounded and their gates applied with decode signals sp1-sp4.

The detecting circuit 45 is a differential amplifier, having as input signals a reference voltage VREF and a voltage Vmonpo1 of node N1, and configured to amplify the differential of these input signals. While a diode-connected PMOS transistor Dp1 and an NMOS transistor Dn1 are connected in series to form a current path between the voltage terminal of voltage VTRIM-A and a node N2, likewise, a PMOS transistor Dp2 and an NMOS transistor Dn2 are connected in series to form a separate current path between the voltage terminal of voltage VTRIM-A and the node N2. Note that, the voltage VTRIM-A need only be a voltage at which the differential amplifier operates. That is, the voltage VTRIM-A may be the same voltage as voltage VTRIM or may differ from Voltage VTRIM. The PMOS transistors Dp1 and Dp2 have their gates commonly connected. Moreover, gates of the NMOS transistors Dn1 and Dn2 are supplied with the reference voltage VREF and the voltage Vmonpo1 of node 1, respectively. NMOS transistors Dn3 and Dn4 are connected between node N2 and the ground terminal. The NMOS transistor Dn3 has its gate applied with a control signal IREF for controlling a current flowing in the differential amplifier. The NMOS transistor Dn4 has its gate applied with a signal SW for controlling start/stop of operation of the differential amplifier.

In addition, the drain of the transistor Dp2 is set to an output terminal which is for outputting an output signal OUTPUTpo of the differential amplifier. Note that when the drive capacity of the output buffer circuit is defined by the current at the time the output signal of the output buffer circuit attains a voltage which is half of the power supply voltage VCC (VCC/2), the reference voltage VREF is set to 0.5×VCC and the voltage VTRIM is set to the voltage VCC. Note that this trimming circuit includes a counter not shown and is configured such that output of the signals pc1-pc3 is switched in accordance with output of this counter.

Operation of this trimming circuit shown in FIG. 5 is described in detail below. First, the gate signal NGTRIM1 is set to "H", then the decode signals sp1-sp4 are set appropriately to "H" or "L" according to the amount of the current expected to flow in the buffer circuits BUFFER [1]-[4], thereby determining the magnitude of the constant current supplied from the constant current circuit 43. Subsequently, the switching signals pc1-pc3 in the switching circuit 41 are switched appropriately to "H" or "L" in accordance with the output signal of the counter not shown, thereby selectively supplying a current to some or all of the PMOS transistors Tpo1-Tpo3 in the dummy circuit 42. The switching signals pc1-pc3 are thereby sequentially switched. Then, the signals pc1-pc3 at the time the detecting circuit 45 detects that the current flowing in the PMOS transistors Tpo1-Tpo3 and the constant current supplied by the constant current circuit 43 are in balance (at the time the output signal OUTPUTpo changes from "H" to "L") are specified in accordance with the output signal of the counter (not shown). Then, it is determined, in accordance with the signals pc1-pc3 at this time, which of the transistors POA1-POA3 in FIG. 1 are to be operated and which are to be set to the non-operation state (trimming information is determined). This operation can be performed for each buffer circuit BUFFER [1]-[4].

Note that switching of the switching signals pc1-pc3 may be configured to be performed in stages such that the total size of the transistors Tpo1-Tpo3 attaining operation state in the dummy circuit 42 gradually increases, or it may be performed such that the size gradually decreases. Moreover, the number of transistors Tpo in the dummy circuit 42 need not be the same as the number of PMOS transistors or NMOS transistors in one buffer circuit BUFFER [i], and may be set to a different number. For example, four or more transistors Tpo may be provided in FIG. 5.

[Fifth Embodiment]

Figure 6:
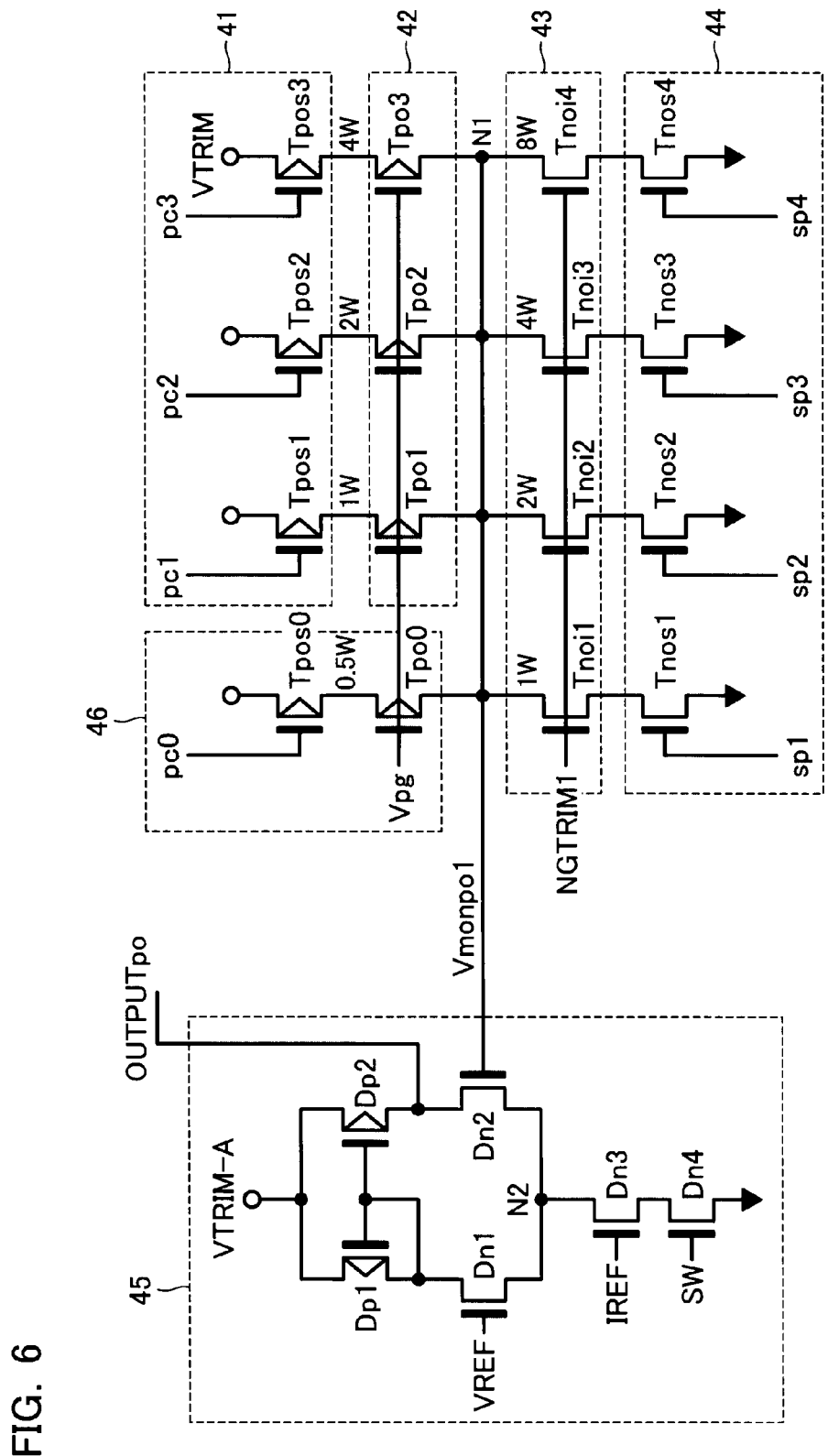
FIG. 6 is a circuit diagram of a CMOS output buffer circuit in accordance with a fifth embodiment of the present invention.

Next, a trimming circuit of a CMOS output buffer circuit in accordance with a fifth embodiment of the present invention is described with reference to FIG. 6. This fifth embodiment includes features in the trimming circuit, similarly to the fourth embodiment. In FIG. 6, identical symbols are assigned to configurative elements identical to those of the trimming circuit in FIG. 5, and detailed descriptions thereof are omitted.

This trimming circuit further includes a dummy half bit circuit 46 in addition to the configuration of the trimming circuit in FIG. 5. This dummy half bit circuit 46 is a circuit having PMOS transistors Tpos0 and Tpo0 (half transistor) connected in series to form a current path between the voltage terminal of voltage VTRIM and node N1. The transistor Tpo0 is switchable between an on state and an off state through application of the voltage Vpg to its gate, similarly to transistors Tpo1-Tpo3. Moreover, the transistor Tpos0 is switchable between an on state and an off state by application to its gate of a signal pc0 other than the signals pc1-pc3. Specifically, at a certain timing close to when at least one of the transistors Tpos1-Tpos3 switches between the on state and the off state, the signal pc0 switches from "L" to "H". Subsequently, the signal pc0 returns to "L", and then, at a certain timing, at least one of the transistors Tpos1-Tpos3 switches again between the on state and the off state.

The transistor Tpo0 (half transistor) has a size such that its on-state current is half that of transistor Tpo1 (for example, the transistor Tpo0 has its gate length the same as transistor Tpo1 and its gate width half that of transistor Tpo1). That is, the transistors Tpo0-Tpo3 are formed having a size ratio of 0.5:1:2:4. The transistor Tpo1 has a size equivalent to the size of the transistor POA1 in FIG. 1, and the transistor Tpo0 has a size equivalent to half that of the transistor POA1.

This trimming circuit of FIG. 6 enables the trimming operation to be executed even more accurately than in the trimming circuit of FIG. 5. The reason is because the trimming operation can be executed stepping up the transistor size in step-up widths of 0.5W (where W is the size of transistor Tpo1). That is, by also switching the logic of the signal pc0 close in time to the change in logic of the signals pc1-pc3, the trimming operation can be performed with step-up widths of 0.5W, rather than with step-up widths of W.

FIG. 7 shows advantages of the trimming circuit of the present embodiment. This table shows how much precision of the trimming operation changes between when there is no dummy half bit circuit 46 (case1-4) and when the dummy half bit circuit 46 is used (case5-8). Although in either of case1-4 or case5-8, on/off of the transistors Tpos1-Tpos3 turned on in the trimming circuit is changeable in accordance with change in the count value of the counter not shown, in case5-8, the transistor Tpo0 also is changeable between on/off in between these transistors Tpos1-Tpos3. For example, in case1, although of the time that the lower two bits of the count value (output signal) of the counter is (0,0) (N-1th time) and the time that they are (1,0) (Nth time), (0,0) is closer to a more appropriate trimming value (shown by "when answer was here" in FIG. 7), (1,0) gets calculated as the appropriate trimming value. However, when the dummy half bit circuit 46 is used to step-up 0.5W at a time, (0,0) can be calculated as the appropriate trimming value. Similarly, an advantage due to using the dummy half bit circuit 46 can be found also in case3 and case7.

[Sixth Embodiment]

Next, a trimming circuit of a CMOS input buffer circuit in accordance with a sixth embodiment of the present invention is described with reference to FIG. 8. This sixth embodiment includes features in the trimming circuit for trimming the PMOS transistors pi1-pi3 in FIG. 4. A configuration of this trimming circuit is described below with reference to FIG. 8. This trimming circuit comprises a switching circuit 141, a dummy circuit 142, a constant current circuit 143, a decode circuit 144, the detecting circuit 45, and a dummy half bit circuit 146.

The detecting circuit 45 has a structure identical to that of the detecting circuit 45 in FIG. 5. Moreover, the switching circuit 141, constant current circuit 143, decode circuit 144, and dummy half bit circuit 146 are identical to the switching circuit 41, constant current circuit 43, decode circuit 44, and dummy half bit circuit 46 in FIG. 5; and transistors Tpis1-Tpis3, transistors Tnii1-Tnii4, and transistors Tnis1-Tnis4 in FIG. 8 correspond to the transistors Tpos1-Tpos3, transistors Tnoi1-Tnoi4, and transistors Tnos1-Tnos4 in FIG. 5.

The dummy circuit 142 comprises PMOS transistors Tpi1-Tpi3 (dummy transistors). These PMOS transistors Tpi1-Tpi3 have their on-state current ratio of transistors set to 1:2:4, similarly to the transistors pi1-pi3 shown in FIG. 4. The dummy circuit 142 is a circuit for judging how these transistors pi1-pi3 will operate under certain conditions.

The PMOS transistors Tpi1-Tpi3 may have a size identical to that of the transistors pi1-pi3, or they may have a size smaller than that of the transistors pi1-pi3. When the PMOS transistors Tpi1-Tpi3 have a size smaller than that of the transistors pi1-pi3, a magnitude of a constant current supplied from the constant current circuit 143 also is set to a value that accords with this size.

Note that this trimming circuit is used in trimming of the PMOS transistors in a CMOS input buffer circuit such as that shown in FIG. 4 (how many of the transistors pi1-pi3 in FIG. 4 are to be rendered in an operable state). Therefore, the transistors Tpi1-Tpi3 in the dummy circuit 142 and the transistor Tpi0 in the dummy half bit circuit 146 have their gates connected to node 1. This enables operation of the CMOS input buffer circuit in FIG. 4 in the case that the voltage of gates of the transistors pi1-pi3 in FIG. 4 is ½ VCC to be verified in the trimming circuit.

[Seventh Embodiment]

Figure 9:
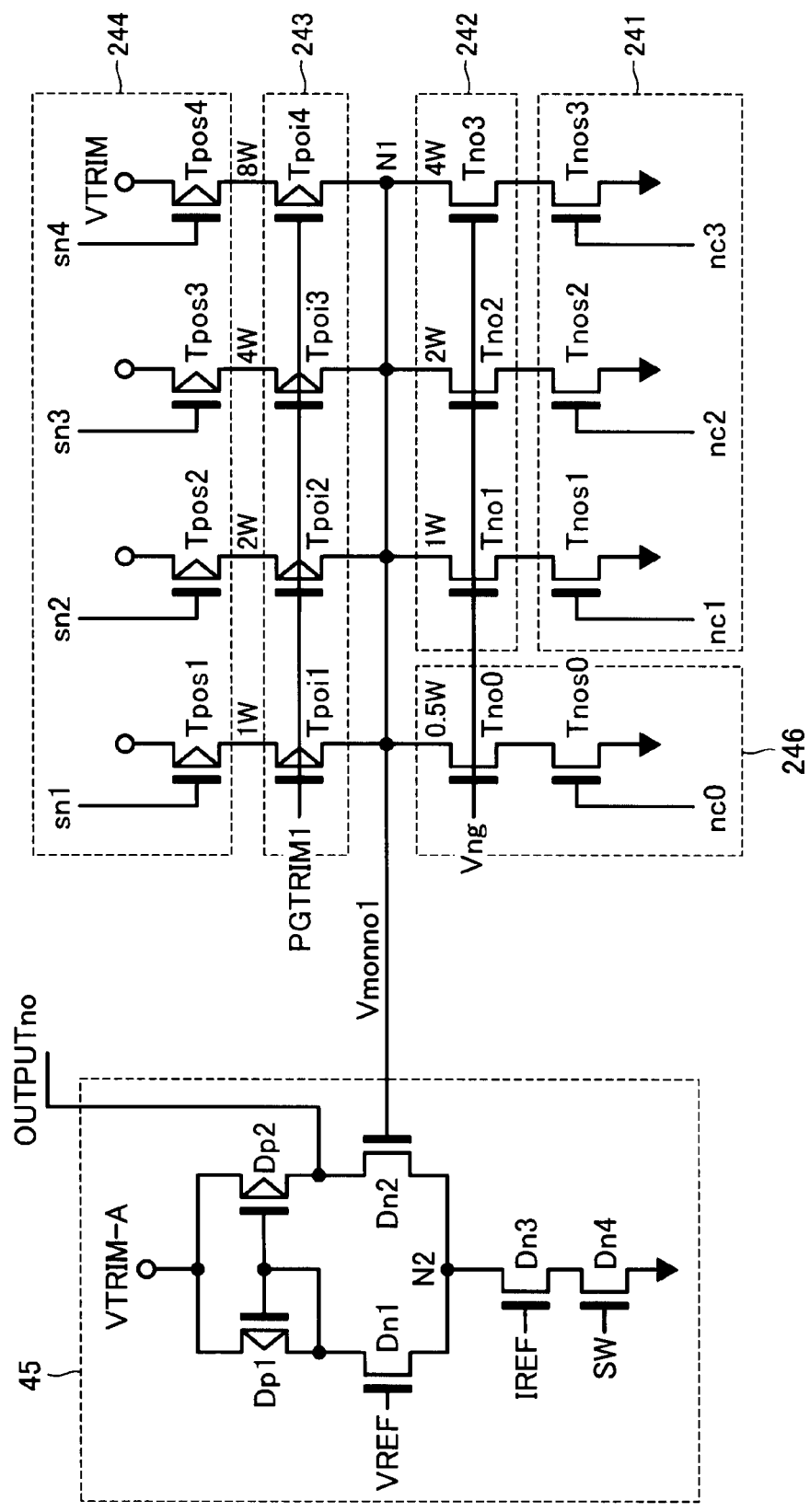
FIG. 9 is a circuit diagram of a CMOS output buffer circuit in accordance with a seventh embodiment of the present invention.

Next, a trimming circuit of a CMOS output buffer circuit in accordance with a seventh embodiment of the present invention is described with reference to FIG. 9. This seventh embodiment differs from the fourth and fifth embodiments in comprising a trimming circuit such as that shown in FIG. 9 as a trimming circuit for trimming the NMOS transistors NOA1-NOA3, NOB1-NOB3, NOC1-NOC3, and NOD1-NOD3 of the buffer circuits BUFFER [1]-[4] in FIG. 1 (this trimming being an operation for determining how many of the transistors NOA1-NOA3, NOB1-NOB3, NOC1-NOC3, and NOD1-NOD3 are to be rendered in an operable state). It is also possible to additionally provide a trimming circuit for PMOS transistors such as that of the fourth and fifth embodiments (FIGS. 5 and 6) in conjunction with the trimming circuit for NMOS transistors of the kind of the present embodiment (FIG. 9). Alternatively, trimming reflecting a trimming result of the trimming circuit for NMOS transistors in this embodiment (FIG. 9) may also be executed on the PMOS transistors.

This trimming circuit comprises a switching circuit 241, a dummy circuit 242, a constant current circuit 243, a decode circuit 244, the detecting circuit 45, and a dummy half bit circuit 246. Note that, if a step-up width of W is sufficient and there is no requirement for a trimming operation with a step-up width of 0.5 W such as that previously mentioned, the dummy half bit circuit 246 may be omitted.

The dummy circuit 242 comprises NMOS transistors Tno1-Tno3. These NMOS transistors Tno1-Tno3 have their on-state current ratio of transistors set to 1:2:4, similarly to the transistors NOA1-NOA3, NOB1-NOB3, NOC1-NOC3, and NOD1-NOD3 shown in FIG. 1. The dummy circuit 242 is a circuit for judging how these transistors NOA1-NOA3, NOB1-NOB3, NOC1-NOC3, and NOD1-NOD3 will operate under certain conditions.

The NMOS transistors Tno1-Tno3 may have a size identical to that of the transistors NOA1-NOA3 in FIG. 1, or they may have a size smaller than that of the transistors NOA1-NOA3 in FIG. 1. When the NMOS transistors Tno1-Tno3 have a size smaller than that of the transistors NOA1-NOA3 and so on, a magnitude of a constant current supplied from the constant current circuit 243 also is set to a value that accords with this size.

These transistors Tno1-Tno3 are connected to form a current path between the ground terminal and node N1, and have their gates applied with a voltage Vng (for example, a voltage VCCQ) which is the voltage applied to gates of the transistors NOA1-NOA3, NOB1-NOB3, NOC1-NOC3, and NOD1-NOD3 shown in FIG. 1.

The switching circuit 241 includes NMOS transistors Tnos1-Tnos3 connected to form a current path between sources of these transistors Tno1-Tno3 and the ground terminal. These transistors Tnos1-Tnos3 have on and off state controlled by independent switching signals nc1-nc3.

In addition, the constant current circuit 243 includes four PMOS transistors Tpoi1-Tpoi4, and the decode circuit 244 includes four PMOS transistors Tpos1-Tpos4.

The PMOS transistors Tpoi1-Tpoi4 have their drains connected to node N1 and their sources connected to drains of the PMOS transistors Tpos1-Tpos4. Moreover, gates of the PMOS transistors Tpoi1-Tpoi4 are supplied with a common gate signal PGTRIM1. The PMOS transistors Tpos1-Tpos4 have their sources applied with the voltage VTRIM and their gates applied with decode signals sn1-sn4.

Operation of this trimming circuit shown in FIG. 9 is described in detail below. Basic operation is almost the same as operation of the circuits in FIG. 5 or 6. First, the gate signal PGTRIM1 is set to "L", then the decode signals sn1-sn4 are set appropriately to "H" or "L" according to the amount of the current expected to flow in the buffer circuits BUFFER [1]-[4], thereby determining the magnitude of the constant current supplied from the constant current circuit 243.

Subsequently, the switching signals nc1-nc3 in the switching circuit 241 are switched appropriately to "H" or "L" in accordance with the output signal of the counter not shown, thereby selectively supplying a current to some or all of the NMOS transistors Tno1-Tno3 in the dummy circuit 242. The switching signals nc1-nc3 are thereby sequentially switched. Moreover, during switching of these switching signals nc1-nc3, switching of the switching signal nc0 is also performed. Then, the signals nc1-nc3 at the time the detecting circuit 45 detects that the current flowing in the NMOS transistors Tno1-Tno3 and the constant current supplied by the constant current circuit 243 are in balance are specified in accordance with the output signal of the counter (not shown). Then, it is determined, in accordance with the signals nc1-nc3 at this time, which of the transistors NOA1-NOA3 in FIG. 1 are to be operated and which are to be set to the non-operation state. This operation can be performed for each buffer circuit BUFFER [1]-[4].

[Eighth Embodiment]

Next, a trimming circuit of a CMOS input buffer circuit in accordance with an eighth embodiment of the present invention is described with reference to FIG. 10. This eighth embodiment includes features in the trimming circuit for trimming the NMOS transistors ni1-ni3 in FIG. 4. A configuration of this trimming circuit is described below with reference to FIG. 10. This trimming circuit comprises a switching circuit 341, a dummy circuit 342, a constant current circuit 343, a decode circuit 344, the detecting circuit 45, and a dummy half bit circuit 346.

The detecting circuit 45 has a structure identical to that of the detecting circuit 45 in FIG. 5. Moreover, the switching circuit 341, constant current circuit 343, decode circuit 344, and dummy half bit circuit 346 are identical to the switching circuit 241, constant current circuit 243, decode circuit 244, and dummy half bit circuit 246 in FIG. 9; and transistors Tnis0-Tnis3, transistors Tpii1-Tpii4, and transistors Tpis1-Tpis4 in FIG. 10 correspond to the transistors Tnos0-Tnos3, transistors Tpoi1-Tpoi4, and transistors Tpos1-Tpos4 in FIG. 9.

The dummy circuit 342 comprises NMOS transistors Tni1-Tni3 (dummy transistors). These NMOS transistors Tni1-Tni3 have their on-state current ratio of transistors set to 1:2:4, similarly to the transistors ni1-ni3 shown in FIG. 4. The dummy circuit 342 is a circuit for judging how these transistors ni1-ni3 will operate under certain conditions.

The NMOS transistors Tni1-Tni3 may have a size identical to that of the transistors ni1-ni3, or they may have a size smaller than that of the transistors ni1-ni3. When the NMOS transistors Tni1-Tni3 have a size smaller than that of the transistors ni1-ni3, a magnitude of a constant current supplied from the constant current circuit 343 also is set to a value that accords with this size.

The transistors Tni1-Tni3 in the dummy circuit 342 and the transistor Tni0 in the dummy half bit circuit 346 have their gates connected to node 1. This enables operation of the CMOS input buffer circuit in FIG. 4 in the case that the voltage of gates of the transistors ni1-ni3 in FIG. 4 is ½ VCC to be verified in the trimming circuit.

[Ninth Embodiment]

Next, a trimming circuit of an input/output buffer circuit in accordance with a ninth embodiment of the present invention is described with reference to FIG. 11. As shown in FIG. 11, the trimming circuit of this embodiment combines the trimming circuit for PMOS transistors in FIG. 6 and the trimming circuit for NMOS transistors in FIG. 9. Furthermore, the trimming circuit of this embodiment incorporates also functions of the trimming circuits in FIGS. 8 and 10. The trimming circuit is provided with transfer gates TG1-TG4 and transistors pswp2 and nswn2 as a configuration to sequentially execute operations due to these four kinds of trimming circuits. Note that although the dummy half bit circuits 46 and 246 are shown in FIG. 11, these may also be omitted.

The transfer gate TG1 is configured from a PMOS transistor pswp3 and an NMOS transistor pswn3. The transfer gate TG1 has one end applied with the voltage Vpg, and, when signals ps3n and ps3p respectively attain "H" and "L", transfers the voltage Vpg to the other end, that is, to gates of the transistors Tpo0-Tpo3. When the trimming circuit of FIG. 11 is caused to function as the trimming circuit of FIG. 6, this transfer gate TG1 is turned on.

The transfer gate TG2 is configured from a PMOS transistor pswp1 and an NMOS transistor pswn1. The transfer gate TG2 has one end connected to gates of the transistors Tpo--Tpo3 and the other end connected to node N1, and has its on/off state controlled in accordance with gate signals ps1p and ps1n. When the trimming circuit of FIG. 11 is caused to function as the trimming circuit of FIG. 8, this transfer gate TG2 is turned on.

The transfer gate TG3 is configured from a PMOS transistor nswp1 and an NMOS transistor nswn1. The transfer gate TG3 has one end connected to gates of the transistors Tno0-Tno3 and the other end connected to node N1, and has its on/off state controlled in accordance with gate signals ns1p and ns1n. When the trimming circuit of FIG. 11 is caused to function as the trimming circuit of FIG. 10, this transfer gate TG3 is turned on.

The transfer gate TG4 is configured from a PMOS transistor nswp3 and an NMOS transistor nswn3. The transfer gate TG4 has one end connected to gates of the transistors Tno0-Tno3 and the other end supplied with the voltage Vng, and has its on/off state controlled in accordance with gate signals ns3p and ns3n. When the signals ns3n and ns3p respectively attain "H" and "L", the transfer gate TG4 transfers the voltage Vng to gates of the transistors Tno0-Tno3. When the trimming circuit of FIG. 11 is caused to function as the trimming circuit of FIG. 9, this transfer gate TG4 is turned on.

In addition, an NMOS transistor pswp2 has its drain applied with the power supply voltage VCC, its other end connected to gates of the transistors Tpo0-Tpo3, and its gate supplied with a gate signal ps2p.

Meanwhile, an NMOS transistor nswn2 has its source applied with the ground voltage, its other end connected to gates of the transistors Tno0-Tno3, and its gate supplied with a gate signal ns2n.

The operation procedure of this trimming circuit of FIG. 11 is described below. The trimming circuit of FIG. 11 is described here, taking as examples the cases, first, (1) where it is operated as the trimming circuit in FIG. 6, next, (2) where it is operated as the trimming circuit in FIG. 9, subsequently, (3) where it is operated as the trimming circuit in FIG. 8, and, finally, (4) where it is operated as the trimming circuit in FIG. 10. However, this sequence is arbitrary, and any of the circuits of FIGS. 6, 8, 9, and 10 may be operated first.

(9-1) When operated as the trimming circuit of FIG. 6, the transfer gate TG1 and transistor nswn2 are turned on, while the transfer gates TG2, TG3, TG4, and transistor pswp2 are turned off. Subsequently, the operation described in the fifth embodiment is executed.

(9-2) When operated as the trimming circuit of FIG. 9, the transfer gate TG4 and transistor pswp2 are turned on, while the transfer gates TG1, TG2, TG3, and transistor nswn2 are turned off. Subsequently, the operation described in the seventh embodiment is executed.

Figure 8:
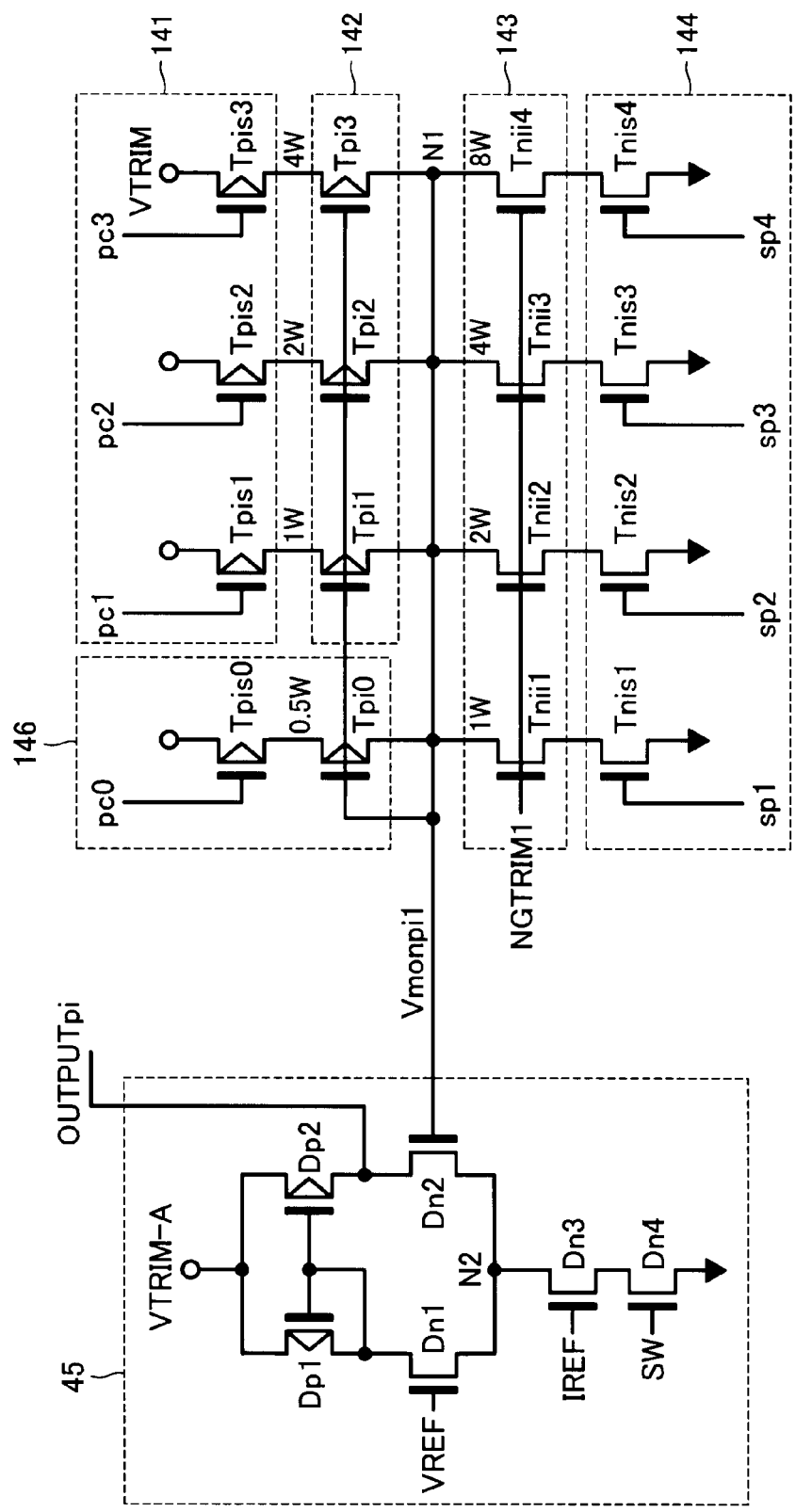
FIG. 8 is a circuit diagram of a CMOS input buffer circuit in accordance with a sixth embodiment of the present invention.

(9-3) When operated as the trimming circuit of FIG. 8, the transfer gate TG2 and transistor nswn2 are turned on, while the transfer gates TG1, TG3, TG4, and transistor pswp2 are turned off. Subsequently, the operation described in the sixth embodiment is executed.

Figure 10:
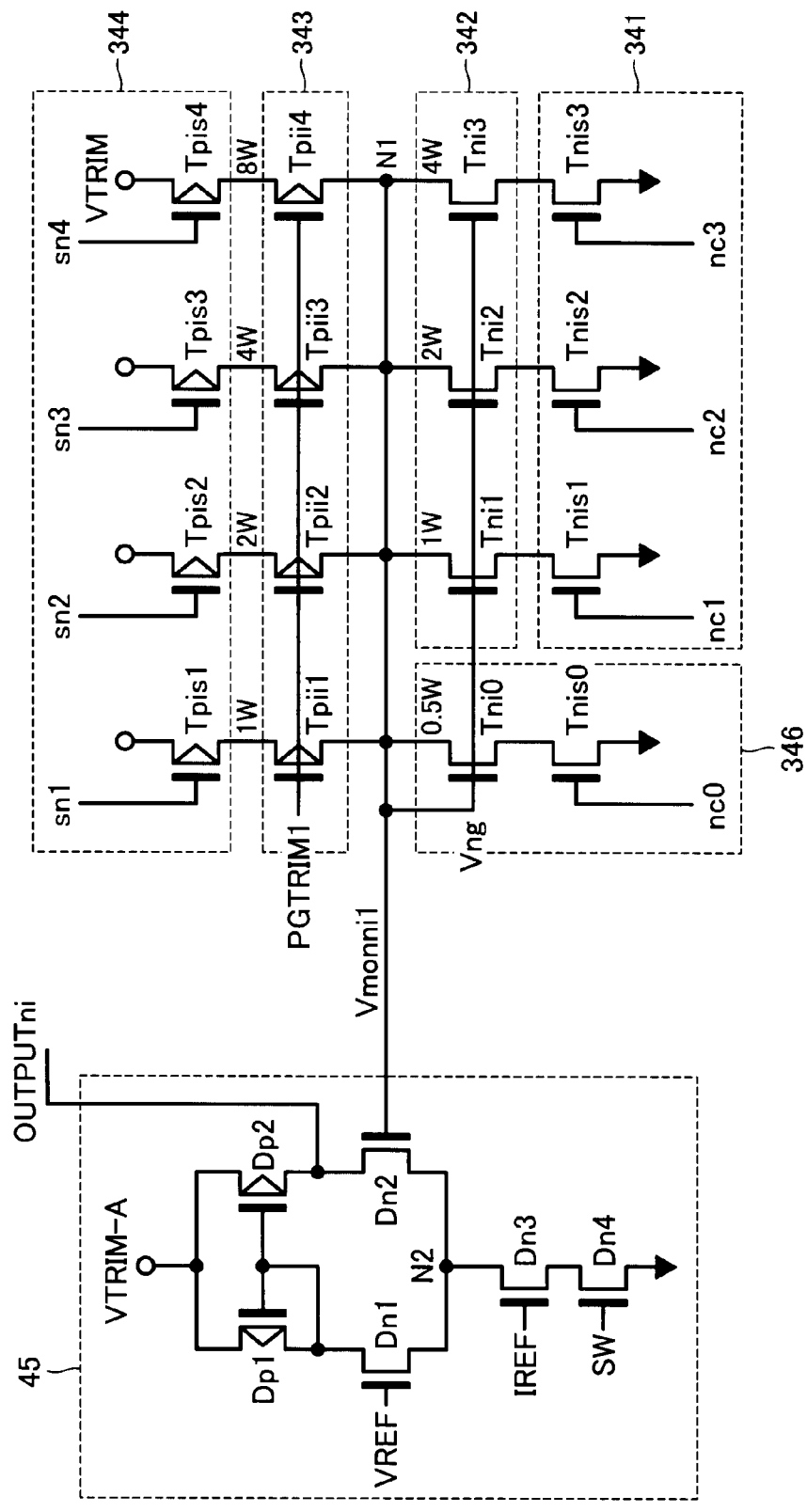
FIG. 10 is a circuit diagram of a CMOS input buffer circuit in accordance with an eighth embodiment of the present invention.
Figure 11:
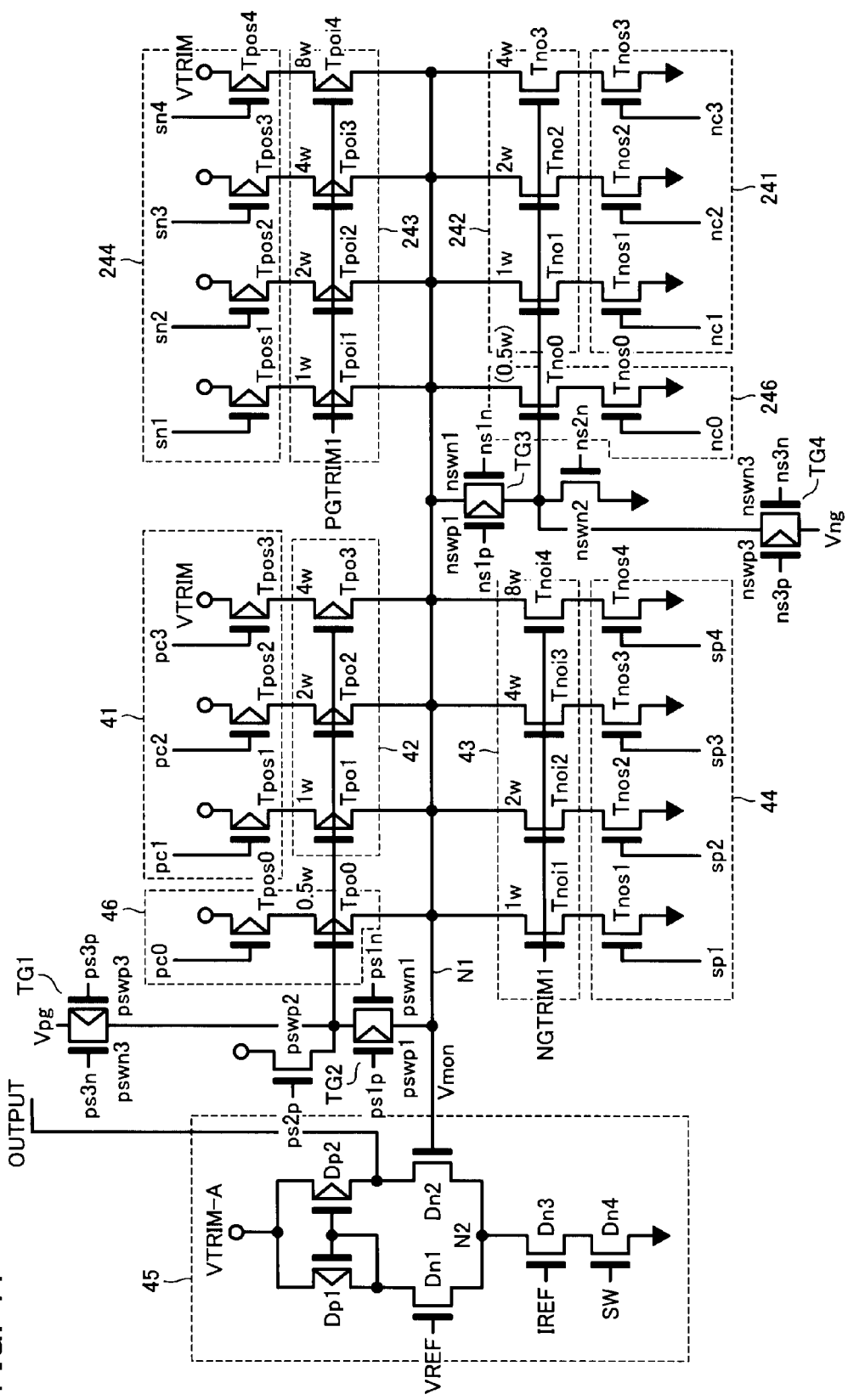
FIG. 11 is a circuit diagram of a CMOS input/output buffer circuit in accordance with a ninth embodiment of the present invention.

(9-4) When operated as the trimming circuit of FIG. 10, the transfer gate TG3 and transistor pswp2 are turned on, while the transfer gates TG1, TG2, TG4, and transistor nswn2 are turned off. Subsequently, the operation described in the eighth embodiment is executed.

[Tenth Embodiment]

Next, a trimming circuit of an input/output buffer circuit in accordance with a tenth embodiment of the present invention is described with reference to FIG. 12. The trimming circuit of this tenth embodiment combines functions of the trimming circuits of FIGS. 6, 8, 9, and 10, similarly to the trimming circuit of FIG. 11. However, the trimming circuit of this embodiment differs from the trimming circuit of the ninth embodiment shown in FIG. 11 in having the constant current circuit 243 and the decode circuit 244 omitted. Other configurations are identical to the configurations shown in FIG. 11, and identical symbols are assigned to identical configurative elements.

Figure 12:
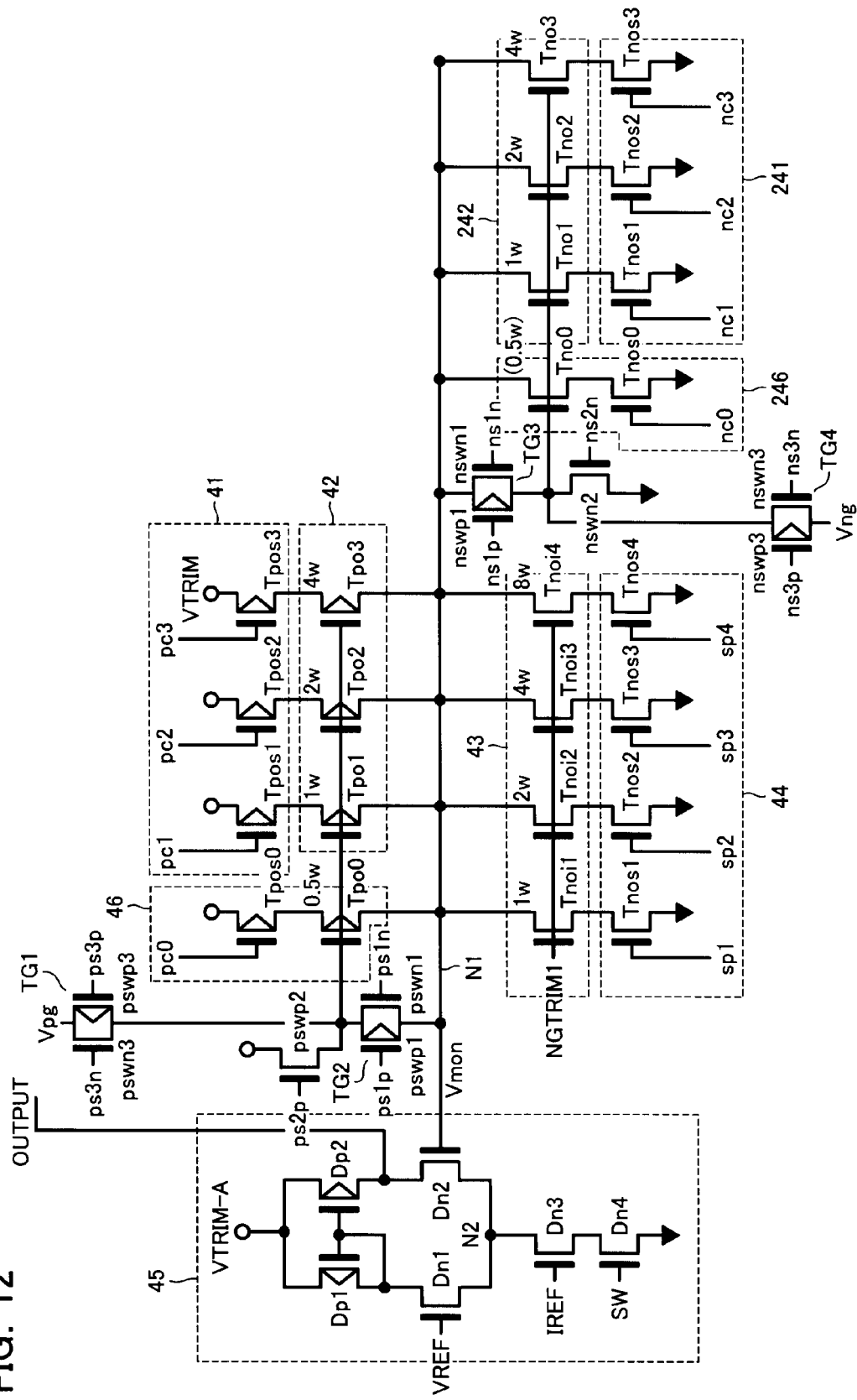
FIG. 12 is a circuit diagram of a CMOS input/output buffer circuit in accordance with a tenth embodiment of the present invention.

When this trimming circuit of FIG. 12 is operated as the trimming circuits shown in FIGS. 9 and 10, a constant current is supplied from the switching circuit 41 and dummy circuit 42 to execute the trimming operation. At that time, a trimming operation can be executed using the switching circuit 41 and dummy circuit 42 that reflect a trimming result subsequent to the trimming circuit being operated as the trimming circuits in FIGS. 6 and 8.

The operation procedure of this trimming circuit of FIG. 12 is described below. The trimming circuit of FIG. 12 is described here, taking as examples the cases, first, (1) where it is operated as the trimming circuit in FIG. 6, next, (2) where it is operated as the trimming circuit in FIG. 9, subsequently, (3) where it is operated as the trimming circuit in FIG. 8, and, finally, (4) where it is operated as the trimming circuit in FIG. 10.

(10-1) When operated as the trimming circuit of FIG. 6, the operation procedure is identical to that described in the ninth embodiment.

(10-2) When operated as the trimming circuit of FIG. 9, the transfer gate TG4 is turned on, and the transfer gate TG2 and transistors pswp2 and nswn2 are turned off. The signals sp1-sp4 are set to "L". However, the transfer gate TG1 is maintained in an on state. Moreover, the signals pc1-pc3 also maintain a logic state in accordance with the trimming result in (10-1). Note that the gate signal pc0 of the dummy half bit circuit 46 is set to "L". Subsequently, the trimming circuit is operated similarly to the ninth embodiment.

(10-3) When operated as the trimming circuit of FIG. 8, the trimming circuit is operated similarly to the ninth embodiment, thereby performing the trimming operation on the PMOS transistors of the CMOS input buffer circuit in FIG. 4.

(10-4) When operated as the trimming circuit of FIG. 10, the transfer gate TG3 is turned on, and the transfer gate TG4 and transistors pswp2 and nswn2 are turned off. The signals sp1-sp4 are set to "L". However, the transfer gate TG1 is maintained in an on state. Moreover, the signals pc1-pc3 also maintain a logic state in accordance with the trimming result in (10-3). Note that the gate signal pc0 of the dummy half bit circuit 46 is set to "L". Subsequently, the trimming circuit is operated similarly to the ninth embodiment.

As described above, the present invention can have fewer circuit elements and a circuit area made smaller than the trimming circuit in FIG. 11. In addition, in the trimming operation of the NMOS transistors in the CMOS output buffer circuit and CMOS input buffer circuit, it is possible for the trimming result of a prior-performed trimming of PMOS transistors to be reflected in the dummy circuit 42, and for the trimming of the NMOS transistors to be performed based on this setting of the dummy circuit 42. This allows trimming error to be reduced compared with the circuit of FIG. 11.

[Eleventh Embodiment]

Next, a trimming circuit of an input/output buffer circuit in accordance with an eleventh embodiment of the present invention is described with reference to FIG. 13. The trimming circuit of this eleventh embodiment combines functions of the trimming circuits of FIGS. 6, 8, 9, and 10, similarly to the trimming circuit of FIG. 11. However, the trimming circuit of this embodiment differs from the trimming circuit of the ninth embodiment shown in FIG. 11 in having the constant current circuit 243 and the decode circuit 244 omitted (in other words, this embodiment shares with the tenth embodiment the fact that the constant current circuit 243 and the decode circuit 244 are omitted). Other configurations are identical to the configurations shown in FIG. 11, and identical symbols are assigned to identical configurative elements.

Figure 13:
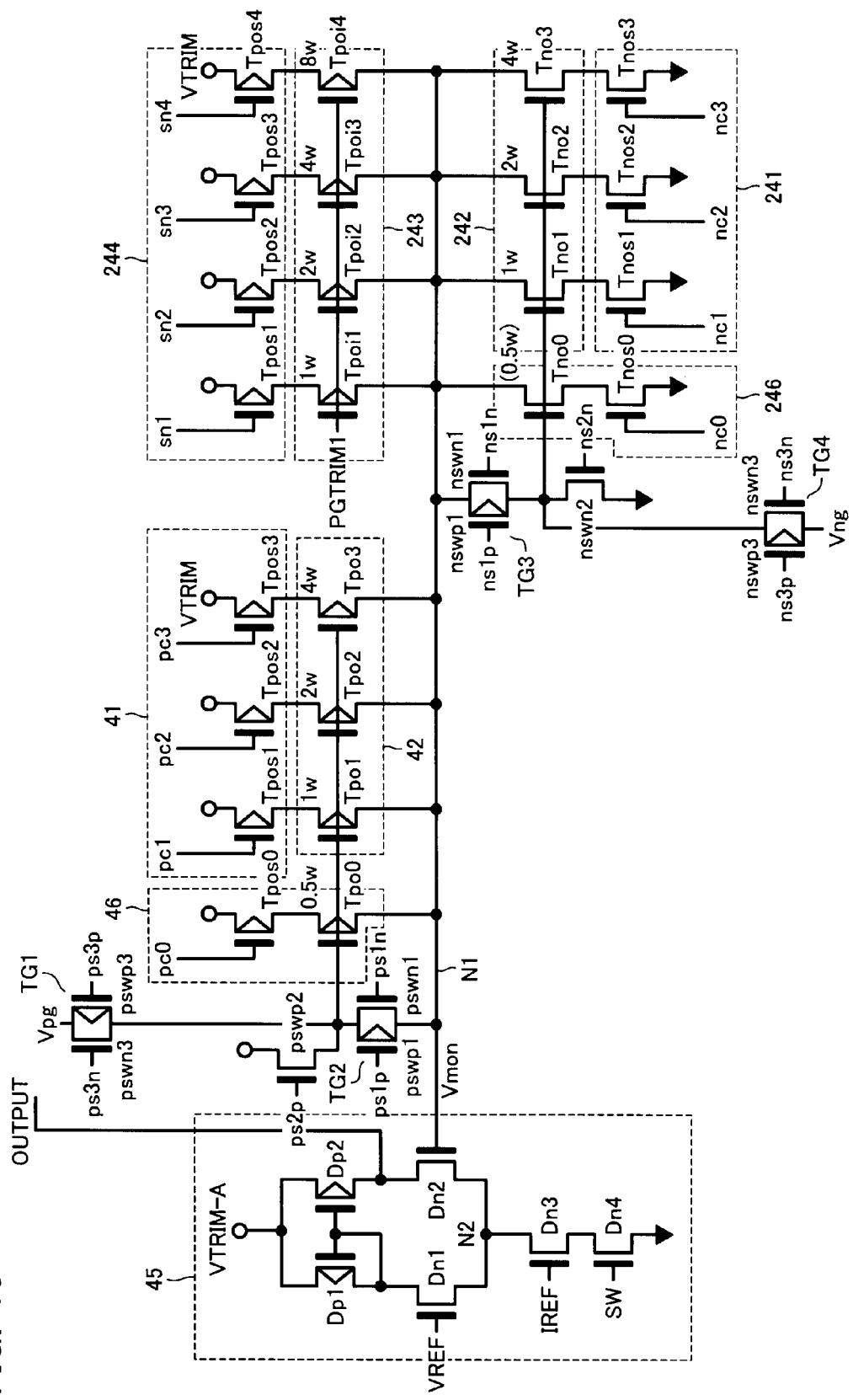
FIG. 13 is a circuit diagram of a CMOS input/output buffer circuit in accordance with an eleventh embodiment of the present invention.

When this trimming circuit of FIG. 13 is operated as the trimming circuits shown in FIGS. 6 and 8, a constant current is supplied from the switching circuit 241 and dummy circuit 242 to execute the trimming operation. At that time, a trimming operation can be executed using the switching circuit 241 and dummy circuit 242 that reflect a trimming result subsequent to the trimming circuit being operated as the trimming circuits in FIGS. 9 and 10. Specific operation resembles that of the trimming circuit in FIG. 12, and a detailed description thereof is thus omitted.

The present invention is not limited to the several above-described embodiments, and various alterations, additions, omissions, modifications, combinations, and so on, are possible within a range not departing from the scope and spirit of the invention. For example, the above-described embodiments are described on the assumption that the voltage VTRIM is constant, but the voltage VTRIM may be changed to various values and a trimming result obtained for each of those differing values. Such trimming results obtained on the basis of differing values of the voltage VTRIM may be written into EEPROM or the like, and settings switched every time there is a change in the voltage used. Moreover, a control circuit or the like for automatically executing the above-described trimming procedure during a die sort test or product test may be installed in a chip.

Alternatively, when one buffer circuit with different drive capacities according to operation conditions is provided, the trimming operation may be performed under different conditions and the multiple cases of trimming results written into EEPROM or the like.

The above-described embodiments allow setting of the drive capacity of buffer circuits to be adjusted after-the-fact on a chip-by-chip basis, uninfluenced by production dispersions on a chip-by-chip basis or by conditions of the power supply voltage used. The above-described embodiments thus make a large contribution to speeding-up of operations in semiconductor integrated circuits.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An output buffer circuit comprising:
    a plurality of buffer circuits, each of the buffer circuits including a transistor operative to change an output signal of an output terminal in response to a change in an input signal, the output buffer circuit being configured to enable the plurality of buffer circuits to be driven selectively,
    each of the plurality of buffer circuits including a plurality of output transistors, each of the output transistors having a first end connected to a first voltage terminal supplying a certain fixed voltage and a second end connected to an output terminal, and being selectively rendered in an operable state in accordance with a control signal provided from external, and
    at least two of the plurality of output transistors included in each of the plurality of buffer circuits being formed having different sizes.

2. The output buffer circuit according to claim 1, further comprising a trimming circuit configured to perform a trimming operation to determine whether any of the plurality of output transistors included in each of the plurality of buffer circuits is to be rendered in an operable state,
    wherein the trimming circuit comprises:
        a dummy circuit including a plurality of dummy transistors having a size ratio identical to that of the plurality of output transistors;
        a switching circuit configured to selectively render some or all of the plurality of dummy transistors in an operable state;
        a constant current circuit configured to supply a constant current to the dummy transistors; and
        a detecting circuit configured to compare the constant current supplied by the constant current circuit and a current flowing in the dummy transistors to output an output signal.

3. The output buffer circuit according to claim 1,
    wherein the output transistors included in each of the plurality of buffer circuits are a plurality of output transistors of a first conductivity type having a first end connected to a first fixed voltage terminal supplying a first fixed voltage and a second end connected to the output terminal, and a plurality of output transistors of a second conductivity type having a first end connected to a second fixed voltage terminal supplying a second fixed voltage and a second end connected to the output terminal, and
    wherein the plurality of output transistors of the first conductivity type and the plurality of output transistors of the second conductivity type included in each of the plurality of buffer circuits are formed respectively having a certain size ratio.

4. The output buffer circuit according to claim 3, further comprising:
    first enable transistors having a first end connected to the first fixed voltage terminal and a second end connected to sources of the output transistors of the first conductivity type, the first enable transistors being configured to be turned on selectively; and
    second enable transistors having a first end connected to the second fixed voltage terminal and a second end connected to sources of the output transistors of the second conductivity type, the second enable transistors being configured to be turned on selectively.

5. The output buffer circuit according to claim 3, further comprising a trimming circuit configured to perform a trimming operation to determine whether any of the plurality of output transistors of the first conductivity type included in each of the plurality of buffer circuits is to be rendered in an operable state, wherein the trimming circuit comprises:
- a dummy circuit including a plurality of dummy transistors having a size ratio identical to that of the plurality of output transistors of the first conductivity type included in each of the plurality of buffer circuits;
- a switching circuit configured to selectively render some or all of the plurality of dummy transistors in an operable state;
- a constant current circuit configured to supply a current to the dummy transistors; and
- a detecting circuit configured to compare a constant current supplied by the constant current circuit and a current flowing in the dummy transistors to output an output signal.

6. The output buffer circuit according to claim 5, further comprising a dummy half bit circuit configured to operate simultaneously with the trimming circuit to perform the trimming operation,
- wherein the dummy half bit circuit includes a half transistor having a size which is half that of the dummy transistors of smallest size.

7. The output buffer circuit according to claim 3, further comprising a trimming circuit configured to perform a trimming operation to determine whether any of the plurality of output transistors of the second conductivity type included in each of the plurality of buffer circuits is to be rendered in an operable state,
wherein the trimming circuit comprises:
- a dummy circuit including a plurality of dummy transistors having a size ratio identical to that of the plurality of output transistors of the second conductivity type included in each of the plurality of buffer circuits;
- a switching circuit configured to selectively render some or all of the plurality of dummy transistors in an operable state;
- a constant current circuit configured to supply a current to the dummy transistors; and
- a detecting circuit configured to compare a constant current supplied by the constant current circuit and a current flowing in the dummy transistors to output an output signal.

8. The output buffer circuit according to claim 7, further comprising a dummy half bit circuit configured to operate simultaneously with the trimming circuit to perform the trimming operation,
- wherein the dummy half bit circuit includes a half transistor having a size which is half that of the dummy transistors of smallest size.

9. An input buffer circuit, comprising:
- a plurality of input transistors of a first conductivity type each configured to be connected between a first fixed voltage terminal supplying a first fixed voltage and an output terminal;
- a plurality of input transistors of a second conductivity type each configured to be connected between a second fixed voltage terminal supplying a second fixed voltage and the output terminal;
- an input terminal commonly connected to gates of the plurality of input transistors of the first conductivity type and gates of the plurality of input transistors of the second conductivity type;
- an output terminal connected to drains of the plurality of input transistors of the first conductivity type and drains of the plurality of input transistors of the second conductivity type;
- first trimming transistors, each of the first trimming transistors being connected between the first fixed voltage terminal and sources of the input transistors of the first conductivity type, and being configured to be selectively turned on to switch the input transistors of the first conductivity type between an operation state and a non-operation state; and
- second trimming transistors, each of the second trimming transistors being connected between the second fixed voltage terminal and sources of the input transistors of the second conductivity type, and being configured to be selectively turned on to switch the input transistors of the second conductivity type between an operation state and a non-operation state independently of a corresponding one of the first trimming transistors connected in series,
the plurality of input transistors of the first conductivity type and the plurality of input transistors of the second conductivity type being respectively formed having a certain size ratio.

10. The input buffer circuit according to claim 9, further comprising a trimming circuit configured to perform a trimming operation to determine whether any of the plurality of input transistors of the first conductivity type is to be rendered in an operable state,
wherein the trimming circuit comprises:
- a dummy circuit including a plurality of dummy transistors having a size ratio identical to that of the plurality of input transistors of the first conductivity type;
- a switching circuit configured to selectively render some or all of the plurality of dummy transistors in an operable state;
- a constant current circuit configured to supply a current to the dummy transistors; and
- a detecting circuit configured to compare a constant current supplied by the constant current circuit and a current flowing in the dummy transistors to output an output signal.

11. The input buffer circuit according to claim 10, further comprising a dummy half bit circuit configured to operate simultaneously with the trimming circuit to perform the trimming operation,
- wherein the dummy half bit circuit includes a half transistor having a size which is half that of the dummy transistors of smallest size.

12. The input buffer circuit according to claim 9, further comprising a trimming circuit configured to perform a trimming operation to determine whether any of the plurality of input transistors of the second conductivity type is to be rendered in an operable state,
wherein the trimming circuit comprises:
- a dummy circuit including a plurality of dummy transistors having a size ratio identical to that of the plurality of input transistors of the second conductivity type;
- a switching circuit configured to selectively render some or all of the plurality of dummy transistors in an operable state;
- a constant current circuit configured to supply a current to the dummy transistors; and
- a detecting circuit configured to compare a constant current supplied by the constant current circuit and a current flowing in the dummy transistors to output an output signal.

13. The input buffer circuit according to claim 12, further comprising a dummy half bit circuit configured to operate simultaneously with the trimming circuit to perform the trimming operation,
- wherein the dummy half bit circuit includes a half transistor having a size which is half that of the dummy transistors of smallest size.

14. The input buffer circuit according to claim 9, wherein at least two of the plurality of input transistors of the first conductivity type and at least two of the plurality of input transistors of the second conductivity type are formed having different sizes.

15. An input/output buffer circuit comprising:
an output buffer circuit and an input buffer circuit,
the output buffer circuit including a plurality of output transistors, each of the output transistors having a first end connected to a first voltage terminal supplying a certain fixed voltage and a second end connected to an output terminal, and being selectively rendered in an operable state in accordance with a control signal provided from external,
the plurality of output transistors being formed having a certain size ratio, and
the output buffer circuit further comprising a first trimming circuit configured to execute a trimming operation to determine whether any of the plurality of output transistors is to be rendered in an operable state,
the input buffer circuit comprising:
a plurality of input transistors of a first conductivity type each configured to be connected between a first fixed voltage terminal supplying a first fixed voltage and an output terminal;
a plurality of input transistors of a second conductivity type each configured to be connected between a second fixed voltage terminal supplying a second fixed voltage and the output terminal;
an input terminal commonly connected to gates of the plurality of input transistors of the first conductivity type and gates of the plurality of input transistors of the second conductivity type; and
an output terminal connected to drains of the plurality of input transistors of the first conductivity type and drains of the plurality of input transistors of the second conductivity type,
the plurality of input transistors of the first conductivity type and input transistors of the second conductivity type respectively having a certain size ratio, and
the input buffer circuit further comprising a second trimming circuit configured to perform a trimming operation to determine whether any of the plurality of input transistors of the first conductivity type is to be rendered in an operable state or a trimming operation to determine whether any of the plurality of input transistors of the second conductivity type is to be rendered in an operable state,
the first trimming circuit comprising:
a first dummy circuit including a plurality of first dummy transistors having a size ratio identical to that of the plurality of output transistors; and
a first switching circuit configured to selectively render some or all of the plurality of first dummy transistors in an operable state, and
the second trimming circuit comprising:
a second dummy circuit including a plurality of second dummy transistors having a size ratio identical to that of the plurality of input transistors of the first conductivity type or the plurality of input transistors of the second conductivity type; and
a second switching circuit configured to selectively render some or all of the plurality of second dummy transistors in an operable state,
the first dummy transistors and the second dummy transistors being supplied with a constant current from a constant current circuit.

16. The input/output buffer circuit according to claim 15, wherein
the second dummy circuit is configured to function as the constant current circuit when a trimming operation is executed using the first dummy circuit.

17. The input/output buffer circuit according to claim 15, wherein
the first dummy circuit is configured to function as the constant current circuit when a trimming operation is executed using the second dummy circuit.

18. The input/output buffer circuit according to claim 15, wherein the first trimming circuit further comprises a first dummy half bit circuit configured to operate simultaneously with the first trimming circuit to perform the trimming operation, and
wherein the first dummy half bit circuit includes a first half transistor having a size which is half that of the first dummy transistors of smallest size.

19. The input/output buffer circuit according to claim 15, wherein the second trimming circuit further comprises a second dummy half bit circuit configured to operate simultaneously with the second trimming circuit to perform the trimming operation, and
wherein the second dummy half bit circuit includes a second half transistor having a size which is half that of the second dummy transistors of smallest size.

20. The input/output buffer circuit according to claim 15, wherein the output transistors included in the output buffer circuit are a plurality of output transistors of the first conductivity type having a first end connected to a third fixed voltage terminal supplying a third fixed voltage and a second end connected to the output terminal, and a plurality of output transistors of the second conductivity type having a first end connected to a fourth fixed voltage terminal supplying a fourth fixed voltage and a second end connected to the output terminal, and
wherein the plurality of output transistors of the first conductivity type and the plurality of output transistors of the second conductivity type included in the output buffer circuit are formed respectively having a certain size ratio.

21. The input/output buffer circuit according to claim 20, further comprising:
first enable transistors having a first end connected to the third fixed voltage terminal and a second end connected to sources of the output transistors of the first conductivity type, the first enable transistors being configured to be turned on selectively; and
second enable transistors having a first end connected to the fourth fixed voltage terminal and a second end connected to sources of the output transistors of the second conductivity type, the second enable transistors being configured to be turned on selectively.

22. The input/output buffer circuit according to claim 15, wherein at least two of the plurality of output transistors are formed having different sizes, and
at least two of the plurality of input transistors of the first conductivity type and at least two of the plurality of input transistors of the second conductivity type are formed having different sizes.

* * * * *